United States Patent
Pas

(10) Patent No.: US 7,642,153 B2
(45) Date of Patent: Jan. 5, 2010

(54) METHODS FOR FORMING GATE ELECTRODES FOR INTEGRATED CIRCUITS

(75) Inventor: Michael F. Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/877,175

(22) Filed: Oct. 23, 2007

(65) Prior Publication Data

US 2009/0104742 A1  Apr. 23, 2009

(51) Int. Cl.
*H01L 21/8238* (2006.01)
(52) U.S. Cl. ............... 438/230; 438/296; 257/E21.632
(58) Field of Classification Search ............... 438/153, 438/154, 296, 230; 257/E21.632
See application file for complete search history.

(56) References Cited

U.S. PATENT DOCUMENTS

| | | | |
|---|---|---|---|
| 4,933,297 A | 6/1990 | Lu | |
| 5,981,365 A | 11/1999 | Cheek et al. | |
| 6,033,963 A | 3/2000 | Huang et al. | |
| 6,054,355 A * | 4/2000 | Inumiya et al. | 438/296 |
| 6,534,352 B1 * | 3/2003 | Kim | 438/197 |
| 6,599,831 B1 | 7/2003 | Maszara et al. | |
| 6,696,328 B2 | 2/2004 | Rhee et al. | |
| 6,902,994 B2 | 6/2005 | Gong et al. | |
| 7,067,379 B2 | 6/2006 | Wen et al. | |
| 7,078,278 B2 * | 7/2006 | Pan et al. | 438/153 |
| 7,098,094 B2 | 8/2006 | Lu | |
| 7,183,184 B2 * | 2/2007 | Doczy et al. | 438/585 |
| 7,220,662 B2 | 5/2007 | Zhu et al. | |
| 7,416,949 B1 * | 8/2008 | Pas et al. | 438/275 |
| 2002/0130393 A1 * | 9/2002 | Takayanagi et al. | 257/616 |
| 2005/0156238 A1 | 7/2005 | Wen et al. | |
| 2006/0008961 A1 | 1/2006 | Lee et al. | |
| 2006/0046401 A1 | 3/2006 | Kavalieros et al. | |
| 2006/0124974 A1 * | 6/2006 | Cabral et al. | 257/274 |
| 2006/0258156 A1 | 11/2006 | Kittl | |
| 2006/0263961 A1 | 11/2006 | Kittl et al. | |
| 2007/0015334 A1 | 1/2007 | Kittl et al. | |

* cited by examiner

*Primary Examiner*—Phat X Cao
*Assistant Examiner*—Nga Doan
(74) *Attorney, Agent, or Firm*—Warren L. Franz; Wade J. Brady, III; Frederick J. Telecky, Jr.

(57) ABSTRACT

A method of forming an integrated circuit can include the steps of providing a substrate having a semiconducting surface and forming a plurality of semiconducting multilayer features on the substrate surface, the features comprising a base layer and a compositionally different capping layer on the base layer. The method can also include forming spacers on sidewalls of the plurality of features, etching the capping layer, where the etching comprises selectively removing the capping layer, removing at least a portion of the base layer to form a plurality of trenches, and forming gate electrodes in the trenches.

25 Claims, 18 Drawing Sheets

METHODS FOR FORMING GATE ELECTRODES FOR INTEGRATED CIRCUITS

FIELD OF THE INVENTION

The present invention relates to methods for making semiconductor devices, and in particular, methods for form gate electrodes for semiconductor devices.

BACKGROUND

High-k dielectrics (k>10) are known to increase gate capacitance without generally causing unacceptably high gate leakage currents for metal oxide semiconductor (MOS) devices. However, a high-k dielectric layer may not be compatible with gate electrodes formed using traditional polysilicon gates, but can be compatible with certain metal gates. Moreover, metal gates are increasingly used for smaller geometry devices because polysilicon depletion effects in traditional polysilicon gate devices can significantly degrade device characteristics and overall integrated circuit performance.

One process that provides an alternative to polysilicon gates for complementary metal oxide semiconductor (CMOS) devices, is a replacement gate process that can be used to form gate electrodes comprising one or more metal layers. In that process, at least one polysilicon layer, bracketed by a pair of spacers, is removed to create a trench between the spacers. The trench is then filled with at least one metal layer. In another process, a fully silicided gate process (FUSI) can be used to form gate electrodes from metals. In the FUSI process, at least a portion of the polysilicon layer on a gate oxide, bracketed by a pair of spacers, is removed to create a trench between the spacers. The trench is then filled with at least one silicide capable metal. Thermal processing can then be used to fully silicide the remaining polysilicon material.

However, issues arise when working with p-type and n-type doped polysilicon layers. In particular, the varying dry and/or wet etch rates of p-doped and n-doped polysilicon relative to each other make the process of etching the trenches needed for the formation of a metal gate or silicide gate electrode difficult and inconsistent. The result is that generally either the p-type or the n-type gate will be exposed to a significant amount of overetch, resulting in damage to the spacer features or any other exposed features on the wafers. This resulting damage can degrade performance or even render a device unusable.

Accordingly, there is a need for an improved method for forming replacement gate electrodes for CMOS integrated circuits.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the invention, a method of forming a complementary metal oxide semiconductor (CMOS) integrated circuit can include providing a substrate having a semiconducting surface and forming a plurality of semiconducting multilayer features on the substrate surface, where the features comprise a base layer and a compositionally different capping layer on the base layer. The method can also include forming spacers on sidewalls of the plurality of features, etching the capping layer to form a plurality of trenches, and forming gate electrodes in the trenches. In the method, the etching comprises selectively removing the capping layer and removing at least a portion of the base layer to form a plurality of trenches.

In a second embodiment of the invention, a method of forming an integrated circuit can include providing a substrate having a semiconducting surface and forming a plurality of multilayer features on the substrate, where the features can include a dielectric layer, an undoped polysilicon layer and a silicon germanium (SiGe) layer on the polysilicon layer. The method can also include implanting at least one dopant into the features and the substrate surface, where an energy of the implant and a thickness of the SiGe layer are selected to limit a concentration of the dopant in the polysilicon layer to less than $10^{18}$ atoms/cm$^3$. The method can further include forming spacers on sidewalls of the plurality of features, selectively etching the SiGe layer, where the etching removes the capping layer and at least a portion of the polysilicon layer, and removing the polysilicon layer using an etch process, where the etch process removes the polysilicon layer selectively over the dielectric layer. The method can further include depositing a low temperature metal on the dielectric layer to form gate electrodes for a plurality of MOS transistors in the integrated circuit.

DETAILED DESCRIPTION OF THE INVENTION

Figure 1A:
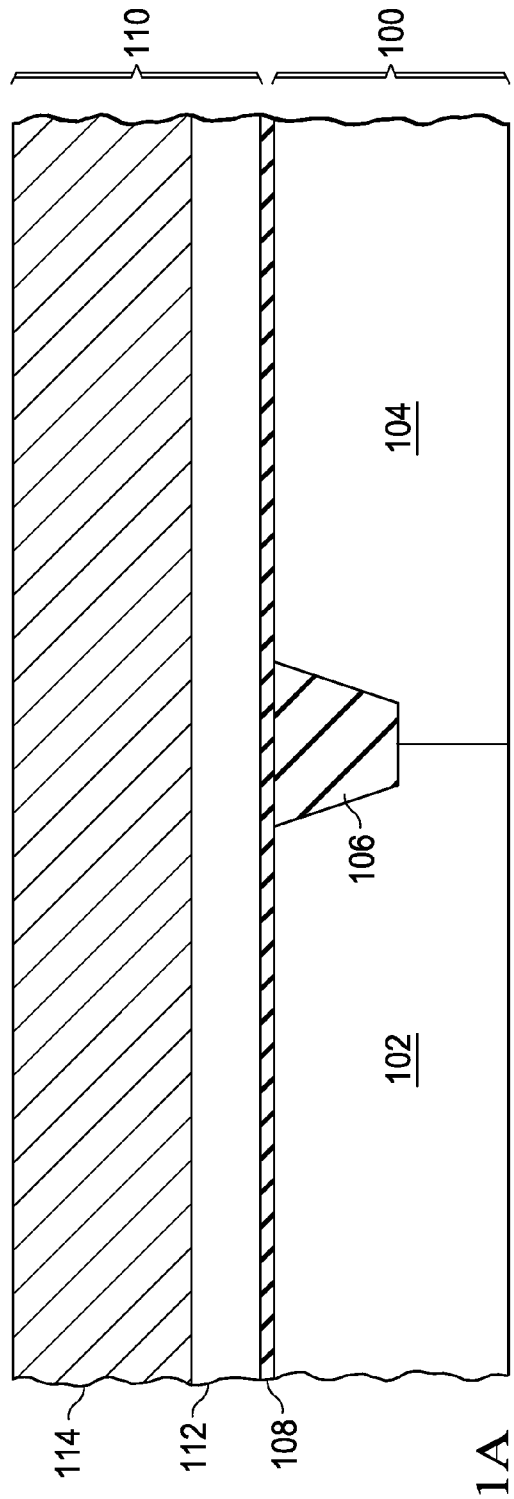
FIGS. 1A-1H show portions of an exemplary process for forming an integrated circuit using a metal gate replacement process according to an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts can occur in different orders and/or concurrently with other acts or events. Furthermore, not all illustrated acts or events are required to implement a methodology in accordance with the present invention.

One embodiment of the present invention provides a method of forming a gate trench structure for forming replacement gate electrodes which eliminates the need for etch stop layers in the multilayer structures used to form the trench, minimizes the amount of damage caused by conventional polysilicon etch processes, and minimizes the amount of variation in etch depth of the polysilicon between n-doped and p-doped regions. Applied to MOS transistors, embodiments of the present invention allow metal gate replacement processes and fully silicided gate (FUSI) processes to be more predictably carried out with reduced process bias from polysilicon etch processes.

The present invention will generally be described as applied to conventional MOS transistors. However, the present invention can also benefit conventional MOS transistor variants, such as double-gate alternatives including planar devices, vertical (pillar) devices and FinFETs.

One exemplary embodiment of the present invention, applied to conventional MOS devices, is shown in FIGS. 1A-1H. Although this exemplary embodiment shows a method for the concurrent formation of a replacement metal gate for NMOS and PMOS devices, it is within the scope of the invention to form the gate electrodes separately, as discussed below. As shown in FIG. 1A, the method comprises the conventional steps of providing a substrate having a semiconductor surface 100 and forming p-doped and n-doped wells 102, 104 for forming NMOS and PMOS devices, respectfully. The wells 102, 104 are electrically insulated from one another by shallow trench isolation (STI) structures 106 formed within the p-well 102 and n-well 104 regions; however, any conventional isolation structure can be used such as field oxide regions (also known as "LOCOS" regions) or implanted isolation regions.

Substrate 100 can comprise a bulk silicon or silicon-on-insulator substructure. Alternatively, substrate 100 can comprise other materials, which can or can not be combined with silicon, such as: germanium, indium antimonide, lead telluride, indium arsenide, indium phosphide, gallium arsenide, or gallium antimonide. Although a few examples of materials from which substrate 100 can be formed are described here, any material that can serve as a foundation upon which a semiconductor device can be built falls within the spirit and scope of the present invention.

Once the p- and n-wells 102, 104 are formed on the substrate 100, a multilayer stack can be deposited on the substrate for forming the MOS gate electrode. First, a dielectric layer 108 can be formed on the surface of the substrate 100. Dielectric layer 108 can comprise silicon dioxide, a nitrided silicon dioxide, a high-dielectric constant (k) dielectric layer, or other materials that can protect the surface of substrate 100. Dielectric layer 108 can be grown or deposited. A high-k dielectric has a dielectric constant greater than 10. In some embodiments, the dielectric layer 108 can be sacrificial and not intended for forming the gate dielectric. In other embodiments, the dielectric layer 108 can also be used as the gate insulator for the MOS device. Therefore, the quality and type of dielectric can vary according to its intended final use. In yet other embodiments, the dielectric layer 108 is not deposited. However, varying uses or the outright omission of the dielectric layer 108 in fabricating a semiconductor device falls within the spirit and scope of the present invention.

After the dielectric layer 108 is formed on the substrate 100, a multi-layer stack 110 can be deposited on dielectric layer 108. The multi-layer stack 110 can comprise at least a first semiconducting base layer 112 and at least a second semiconducting capping layer 114 of a different composition than base layer 112. For example, if the base layer 112 comprises a polysilicon layer, the capping layer 114 can be formed using an alloy of silicon, germanium, and/or carbon, such as $Si_{1-x}Ge_x$, $Si_{1-y}C_y$, or $Si_{1-x-y}Ge_xC_y$. Such silicon alloys can be deposited using various CVD methods, including, but not limited to low pressure chemical vapor deposition (LPCVD) and ultra-high vacuum chemical vapor deposition (UHVCVD) processes. However, the present invention is not limited in this regard and other materials compatible with the process flow, but of a different composition than the capping layer 112 can be used, as will be described below. For example, the base layer 112 can be a layer of Ge or a $Si_{1-x-y}Ge_xC_y$ alloy and the capping layer 114 can be a polysilicon layer.

In some embodiments, stack 110 comprises a polysilicon base layer 112 and a silicon germanium (SiGe) capping layer 114. In such embodiments, the SiGe layer can have a germanium concentration of at least 20 atomic %. In such embodiments, the thickness of a SiGe capping layer 114 can be between 60% and 80% of the total thickness of the stack and still provide adequate masking during implant processes. In these embodiments of the present invention, the total thickness of stack 110 can be between 400 Å to 1,200 Å, such as between 600 Å and 1,000 Å. The lower limit for the total stack thickness is generally imposed to block the source/drain implant from penetrating into the channel region, and the upper limit is imposed based on etching considerations.

The adequate masking ensures that subsequent etch processes for the polysilicon base layer 112 can be controllably performed. That is, the inventor has found that by limiting the resulting dopant concentration in the polysilicon base layer 112 to less than $10^{18}$ atoms/cm$^3$, rather than the typical $10^{19}$ to $10^{20}$ atoms/cm$^3$ resulting doping concentrations in implanted polysilicon during conventional processes, dopant effects on subsequent polysilicon dry etch processes are minimized or eliminated. These concentrations are provided by way of example and not limitation. Higher doping concentrations for the polysilicon are possible, allowing for thinner capping layers 114, depending on the effect of doping concentration on the particular polysilicon etch process being used. Furthermore, the thicknesses of the capping layer 114 and the base layer 112 can also vary depending on the materials being used for such layers.

Figure 1B:
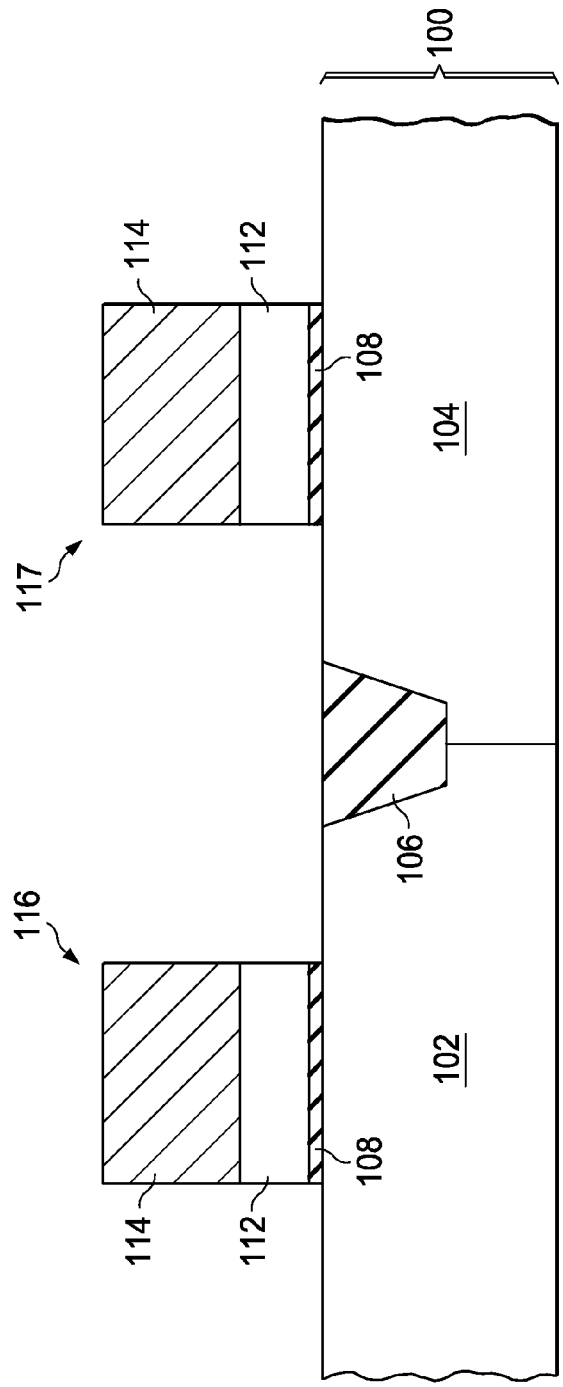

Once the stack 110 is formed on dielectric layer 108, the stack 110 and the dielectric layer 108 can be patterned and etched to form a plurality of features 116, 117 on the substrate 100, as shown in FIG. 1B. In particular, the features 116, 117 can be used to define where MOS devices will be formed on the substrate 100. The features can be formed using, by way of example and not limitation, photolithographic techniques and etch techniques. In some embodiments, to further ensure proper definition of the features 116, 117, a hard mask layer (not shown) can be deposited on top of stack 110 prior to patterning. The hard mask can comprise silicon nitride, silicon dioxide, silicon oxynitride, silicon carbide or other suitable hard mask materials. In the various embodiments, a combination of hard mask and resist may be selected to promote proper definition of features 116, 117.

The features 116, 117 can be etched into stack 110 by transferring the substrate to a dry or wet etch tool, such as a plasma etch reactor or a chemical wet bench. Dry etches, such as plasma-based etches, can be of sufficient energy, duration, and plasma conditions to etch the stack 110 to result in the features 116, 117 illustrated in FIG. 1B. Etch processes can include processes developed using reactive ion etching (RIE), deep (RIE), or plasma enhanced chemical dry etching (CDE) reactors, to name a few. Anisotropic etch processes can be used to provide increased critical dimension (CD) control. However, a wet etch tool can also be configured to etch the stack to form features 116, 117 on the substrate. In some embodiments, the etch tool can be operated to first etch and transfer the pattern for the feature 116, 117 to the hard mask and then to form features 116, 117. Depending upon the material used to form the hard mask, it can be etched by exposing it to a plasma. By way of example and not by limitation, a plasma for etch a hard mask selectively over an underlying polysilicon or silicon alloy layer can be derived from a combination of fluorocarbons, oxygen, and other constituents. Examples include $C_4F_8$, argon and oxygen, or $CH_3F$, carbon monoxide, and oxygen. However, any other plasma etch chemistries providing selectivity over the underlying capping layer 114 are also within the scope of the present invention.

Once the plurality of features 116, 117 is formed on the substrate 100, any type of processing sequence can be used to form the source and drain regions for the MOS devices. Accordingly, the resulting source and drain region can be formed having any number of source and drain regions or extensions (deep, lightly doped drain, halo, and pocket implant regions) by providing any number and types of implants.

The features 117 formed over n-wells are used to form p-channel MOS (PMOS) transistors on the surface of the substrate 100. Therefore, in addition to deep sources and drains, the PMOS transistors can also include source and drain extensions formed from p-type dopants. Illustrative examples of p-type dopants include, but are not limited to: B or In. The source and drain extensions can be lightly doped ("LDD"), medium doped ("MDD"), or highly doped ("HDD"). Similarly, the features 116 formed over the p-well regions on the surface of substrate 100 are used to form n-channel (NMOS) transistors. The NMOS transistors can also include deep sources and drains and source and drain extensions formed from n-type dopants. Similar to PMOS transistor, the source and drain extensions of NMOS transistor can be lightly doped ("LDD"), medium doped ("MDD"), or highly doped ("HDD"). Illustrative examples of n-type dopants that can be employed in the present invention include, but are not limited to: As, P, or Sb. As used herein, implantation refers to broad injection processes, including ion implantation as well as plasma implantation, plasma implantation including pulsed plasma doping and plasma immersion ion implantation.

Therefore, once the plurality of features 116, 117 are formed, the source and drain can be implanted into the surface of substrate 100. The implantation of dopants into the locations for the sources and drains can be accomplished through any one of a variety of processes, such as deep ion implantation or even deep diffusion from a surface dopant source. The dopants used to create the sources and drains for PMOS transistors are typically boron and for NMOS transistors are typically arsenic; however, other dopants or combinations of dopants can be used.

Figure 1C:
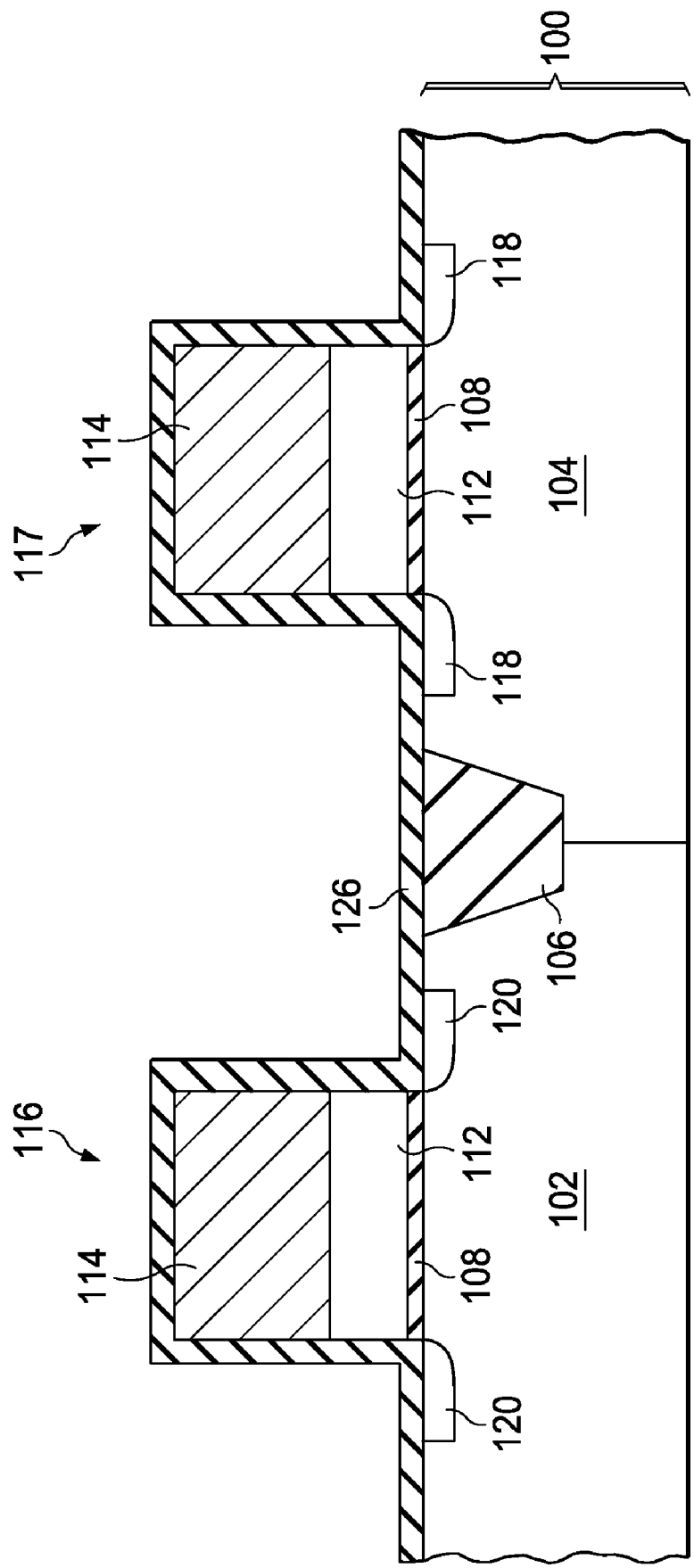

As shown in FIG. 1C, the implantation of the dopants for source drain extensions 118, 120 is self-aligned with respect to the outer edges of the features 116, 117 and both the conventional n and p source/drain extension implants according to the invention can be performed. First a buffer oxide layer 126 can be formed over features 116, 117. A conventional implant process can then be used for forming the n and p source and drain extensions. For example, a photoresist layer or other masking layer (not shown) can then be patterned over the NMOS features 116 and p extension implants into n-well regions 104 can be performed. Similarly, the PMOS features 117 can also be masked to allow for n extension implants into the p-well regions 102.

After the extension regions 118, 120 are formed, spacers 122 can be formed on opposite sides of the features 116, 117 using one or more layers of electrically insulating materials. For example, in some embodiments, the spacers can be formed using silicon nitride. First, a silicon nitride layer 124 of substantially uniform thickness, for example, less than about 1000 Å thick—can be deposited over the entire structure. By way of example and not limitation, conventional deposition processes can be used to generate that structure.

Figure 1D:
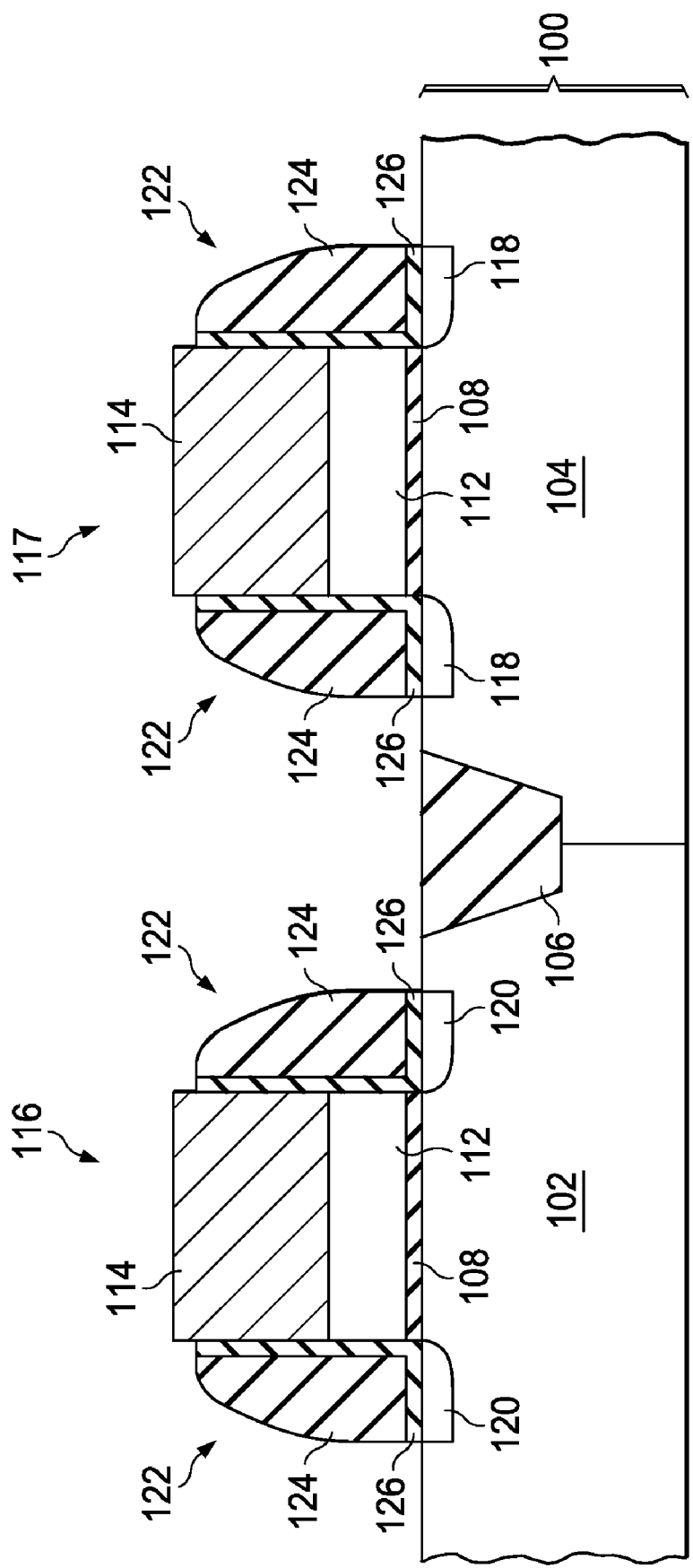
Figure 1E:
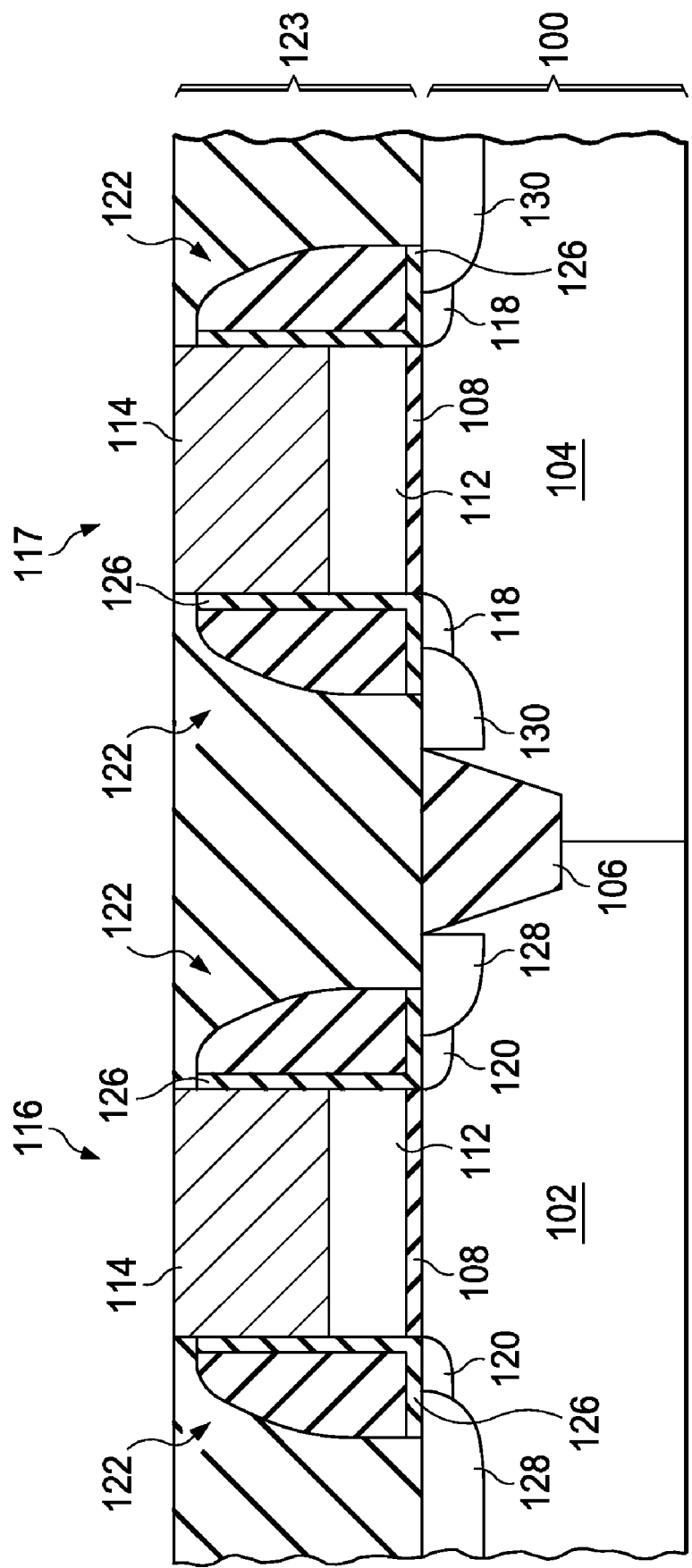

In some embodiments, as shown in FIG. 1D, an additional layer of insulating material, such as buffer oxide layer 126, can be formed prior to forming layer 124. Similarly, although not shown in FIG. 1D, a second oxide can be deposited on layer 124 prior to etching that layer. If used, such an oxide can enable the subsequent silicon nitride etch step to generate an L-shaped spacer. In other embodiments, silicon nitride layer 124 can be deposited directly on substrate 100 and on opposite sides of patterned features 116, 117 after removing buffer oxide layer 126 on substrate 100 and patterned features 116, 117. Silicon nitride layer 124 can be etched using a conventional process for anisotropically etching silicon nitride to create the structure shown in FIG. 1D. As a result of that etch step, each of features 116, 117 is bracketed by a pair of sidewall spacers 122. Once the sidewall spacers 122 are formed, the deep n+ and p+ source/drain implant regions 128, 130 can be formed, as shown in FIG. 1E using the features 116, 117 and the sidewall spacers 122 as a mask. In the resulting structure, the features 116, 117, as well as the surface of the substrate 100 are implanted with dopants.

Figure 1F:
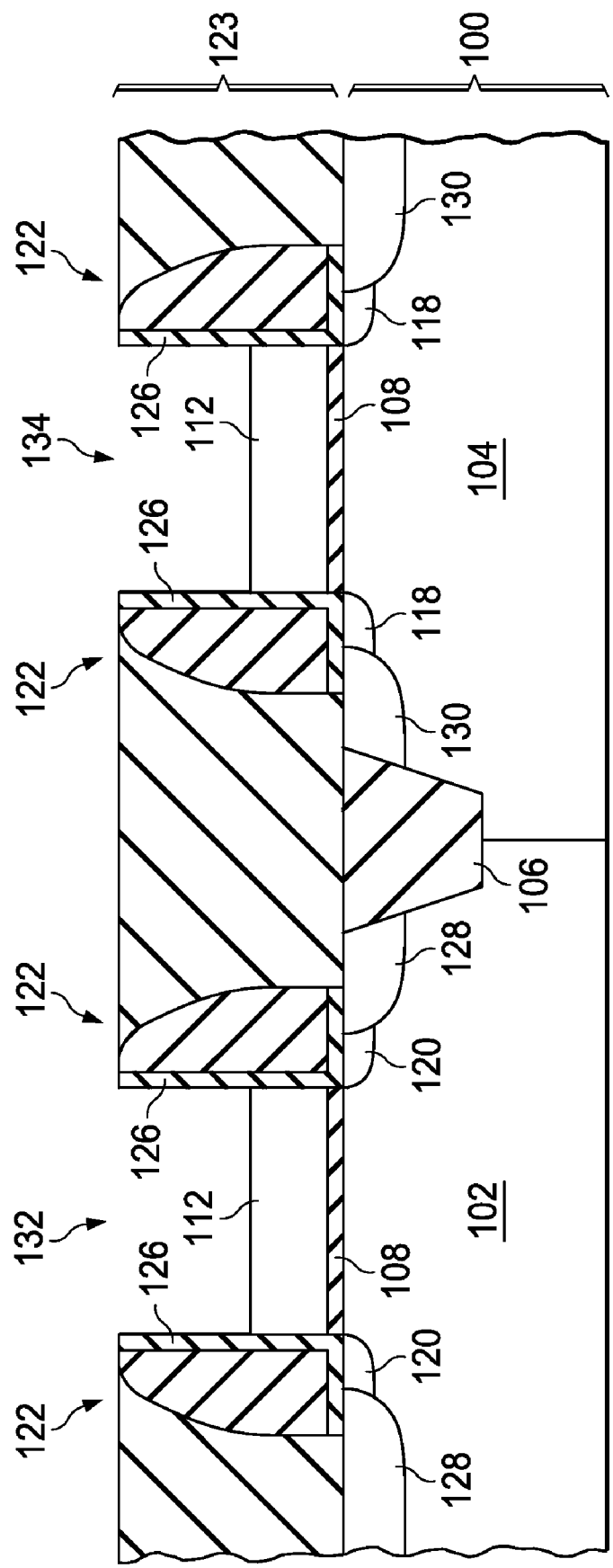

Afterwards, a field dielectric layer 123 can be deposited on the features 116, 117 and a portion of dielectric layer 123 can be removed to expose the top of features 116, 117, as shown in FIG. 1E. In one embodiment, chemical-mechanical planarization or chemical-mechanical polishing, commonly abbreviated CMP, can be used to remove the portion of the dielectric layer 123. A CMP process can be used that stops on the nitride layer 124, resulting in no further polishing CMP process reaches the top of the spacers. Such processes are well-known to those of skill in the art and will not be discussed here. In such embodiments, the top of the capping layer 114 in the features 116, 117 can be left exposed, while other areas of the wafer are protected from further processes by the dielectric layer 123 during processes used to form trenches 132, 134, as shown in FIG. 1F. However, trenches 132, 134 can also be formed without the use of dielectric layer 123.

In general, when forming a trench for depositing metal in a replacement gate process, a polysilicon etch would generally be used to remove the any polysilicon in the trenches. However, as previously noted, the etch rate of polysilicon varies significantly as a result of the dopants implanted into the polysilicon during source and drain implant processes. Typically, the etch rate of n-doped polysilicon will generally be different than the etch rate for p-doped polysilicon for a particular etch process. As a result, a significant amount of overetch of the polysilicon is generally required to ensure that no polysilicon remains on top of the gate dielectric in a replacement metal process. In the case of a fully silicided gate, the varying etch rate results in an unpredictable thickness of poly remaining after polysilicon etch. Therefore, when excess polysilicon remains, the silicide metal may not fully react with the entire volume of polysilicon and the resulting gate electrode may not be completely silicided. However, the inventor has found that by incorporating a capping layer 114 comprising a second and different material, by carefully selecting the thickness of capping material, and by using a selective etch chemistry to etch the capping layer 114 alone, the amount of base layer 112 remaining before a subsequent etch or a silicide process can be more predictable, and therefore provides a more robust process flow. In the case of a polysilicon base layer 112, silicon alloy capping layers provide a capping layer 114 that can be selectively removed without causing damage to the underlying polysilicon base later 112 or other features formed on the substrate 100.

In one embodiment, the present inventors have found that SiGe comprising layers can be used to form the capping layer 112. In particular, the present inventor has found that having a germanium concentration between 20% and 50%, these SiGe layers can be etched selectively over silicon, polysilicon, oxide, and nitride using an aqueous solution of a base such as ammonium hydroxide ($NH_4OH$) and an oxidizer. Other bases that can be used include methyl amines, such as methyl amine and dimethyl amine. The oxidizer can be hydrogen peroxide ($H_2O_2$), but other oxidizers can be used such as other peroxides and sulfoxides. Although the ratio of the components can vary, in at least some embodiments utilizing $H_2O_2$, the ratio of $NH_4OH$, $H_2O_2$ (10% in $H_2O$), and water can vary from 1:2:8 to 1:1:2 and still provide sufficient selectively between a SiGe comprising capping layer 112 and a polysilicon comprising base layer 112.

Therefore, by carefully selecting the ratio of components for the etch solution, the present inventors have found that the etch selectivity of a capping layer 114, comprising SiGe, over silicon, polysilicon, oxide, and nitride can be as low as 5 to 1, and as high as 100 to 1. Furthermore, the present inventors have found that the selectivity also varies depending on the concentration of germanium and that by increasing the concentration of germanium above 20%, the amount of selectivity increases further. As a result of the etch selectivity for the capping layer 114 comprising SiGe, the present inventors have found that such capping layers 114 can be reliably removed from the features 116, 117, with only a negligible or minimal impact on other features on the surface of substrate 100. Such wet etches can be performed in any type of wet etch tool. For example, a SEZ™ 1200 single wafer tool can be used for etching SiGe capping layers 114, as well as single wafer tools produced by FSI International™. Additionally, batch wet etching tools can also be interchangeably used. Accordingly, in the various embodiments of the invention, the etch selectivity of a capping layer 114 over the base layer 112 and other features formed on the substrate 100 can vary. For example, the etch process can be configured such that the etch selectivity is 5 to 1, 10 to 1, 20 to 1, 50 to 1, or 100 to 1.

Accordingly, because the capping layer 114 in features 116, 117 can be removed with little or no etch damage to the underlying base layer 112, the capping layer 114 can be used as an implant masking feature for the underlying base layer 112, provided a selective etch can be provided. That is, by providing a capping layer 114 of sufficient thickness, any subsequent implants can be constrained to only the capping layer 114, leaving the underlying base layer 112 minimized so that subsequent base layer etch rates remain unaffected. Therefore, in embodiments utilizing a polysilicon base layer 112, the thickness of a SiGe capping layer 114 and the energy and dose of implants to be used can be adjusted so that the dopant concentrations in the polysilicon base layer 112 are kept below an integrated dose of $1 \times 10^{13}$ cm$^{-2}$, resulting in a concentration of $1 \times 10^{18}$ atoms/cm$^3$ or less, to maintain uniform and predictable etching of the polysilicon base layer 112. For example, for an implant having a peak concentration of $5 \times 10^{19}$ atoms/cm$^3$ at the surface of the SiGe capping layer 114 and a given range (Rp) and straggle ($\Delta$Rp), the thickness of the SiGe capping layer 114 necessary to achieve a dopant concentration of $1 \times 10^{18}$ atoms/cm$^3$ or less in a polysilicon base 112 layer needs to be greater than Rp+2$\Delta$Rp. Accordingly, as implant energy and dose vary, the thickness of the capping layer 114 needs to be varied in order to mask the implant sufficiently from the base layer 112.

Once the capping layer 114 is etched from the features 116, 117, resulting in trenches 132, 134, as illustrated in FIG. 1F, the polysilicon layer 112 can then be etched to form a replacement metal gate electrode. In these embodiments of the present invention, by limiting the amount of implanted dopants in the base layer 112, the remaining base layer 112 can then be etched using a single etch to uniformly and consistently etch base layer 112 from all features 116, 117, to form the structure shown in FIG. 1G. Although the embodiment illustrated in FIGS. 1A-1H uses dielectric layer 123 to protect other features on the substrate 100, it would be apparent to one of skill in the art that the trenches can be formed without dielectric layer 123, provided the etch process for the capping layer has sufficient selectivity.

Figure 1G:
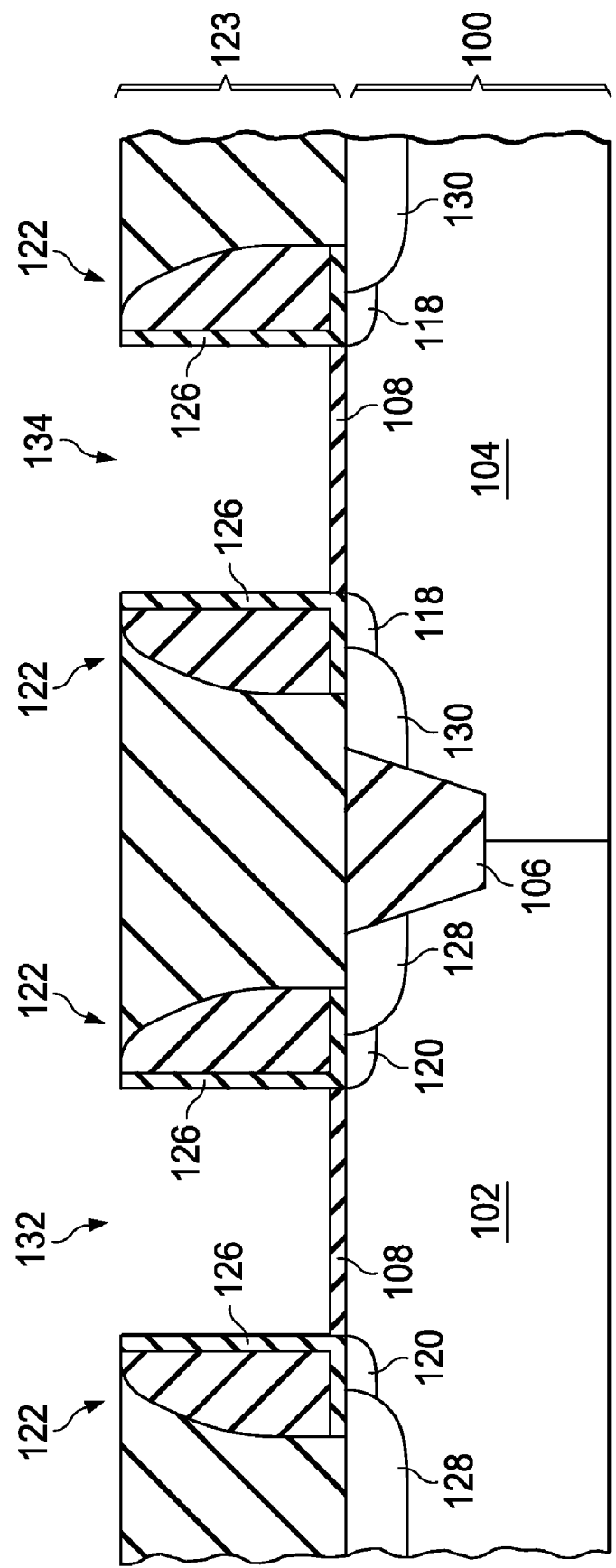
Figure 1H:
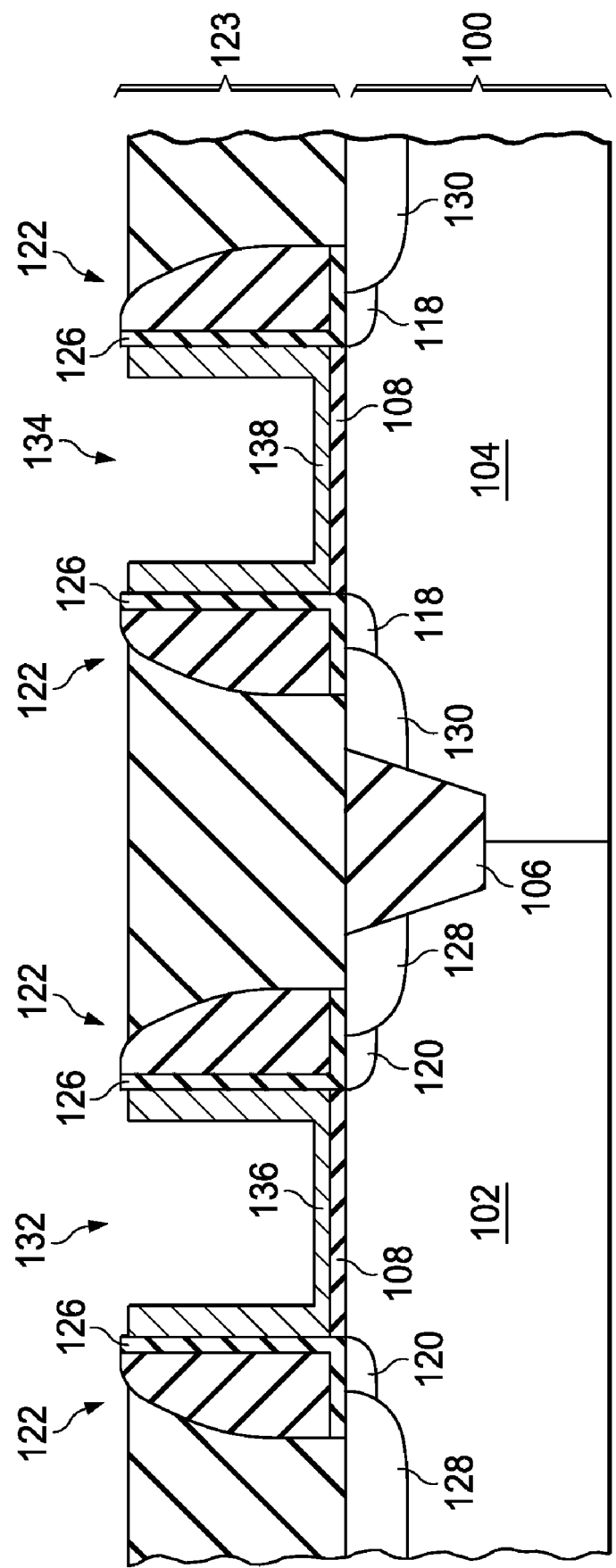

Once the capping layer 114 and base layer 112 are removed, a replacement gate metal can be deposited in the resulting trenches to form the metal gates 136, 138 shown in FIG. 1H. As to be discussed below, the type of metal deposited can vary according to the type of device, NMOS, PMOS, being formed.

Although not shown, in some embodiments the gate insulator can also be replaced during the metal gate replacement process flow. In such embodiments, dielectric layer 108 can be removed and replaced with a final gate dielectric material prior to metal deposition. When dielectric layer 108 comprises silicon dioxide, it can be removed using an etch process that is selective for silicon dioxide relative to the surface of the semiconducting substrate. Such etch processes include exposing layer 108 to a solution that includes about 1 percent HF in deionized water, or applying a dry etch process that employs a fluorocarbon based plasma. In these processes, layer 108 should be exposed for a limited time, as the etch process for removing layer 108 may also remove part of the spacers 122 and STI oxide 106. After removing dielectric layer 108, a final gate dielectric layer, such as a high-k dielectric layer can be formed on the surface of substrate 100 at the bottom of trenches 132, 134.

In either case, material to be used as the gate insulator can generally be less than or equal to 20%, such as 10%, of the spacer thickness in one embodiment. Although the gate insulator can comprise any material that may serve as a gate dielectric for a MOS transistor that includes a metal gate electrode, the gate insulator can comprise a high-k dielectric material. Some of the materials that may be used to make high-k gate dielectric 214 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form a high-k gate insulator are described here, that the gate insulator can be made from other materials. Conventional processes, by way of example and not limitation, can be used to deposit dielectric materials for the gate insulator.

Once the trenches 132, 134 are formed, a conventional low temperature metal process can be used to deposit and pattern metal in the trenches 132, 134, resulting in the structure having metal gate electrodes 136, 138, shown in FIG. 1H. As previously noted metal gate electrodes for NMOS devices 136 and metal gate electrodes for PMOS devices 138 can be different.

As shown in FIG. 1H, the structures illustrated show that the low temperature metal in gate electrodes 136, 138 does not completely fill all of trenches 132, 134. In such embodiments, the remainder of the trenches 132, 134 may be filled with a material that may be easily polished or otherwise etched, e.g., tungsten, aluminum (etched), titanium, or titanium nitride. In such embodiments, the low temperature metal layers 136, 138 can be between about 50 and about 1,000 Å thick.

The resulting structure in FIG. 1H can then be further processed to complete the integrated circuit. For example, a capping dielectric layer (not shown) may be deposited onto the resulting structure of FIG. 1H, using any conventional deposition process. Furthermore, process steps for completing the device that follow the deposition of such a capping dielectric layer, e.g., forming the device's contacts, metal interconnect, and passivation layer, are well known to those skilled in the art and will not be described here.

As previously mentioned, in some embodiments of the present invention it can be desirable to provide separate replacement metal gate electrodes for PMOS and NMOS devices formed from different types of metals. The different types of metal can have a work function that is more suitable for either PMOS or NMOS devices. In such embodiments, additional steps can be used to deposit metal for PMOS and NMOS gates separately and the inclusion of the capping layer 114 can permit such processes to be performed more controllably.

Figure 2A:
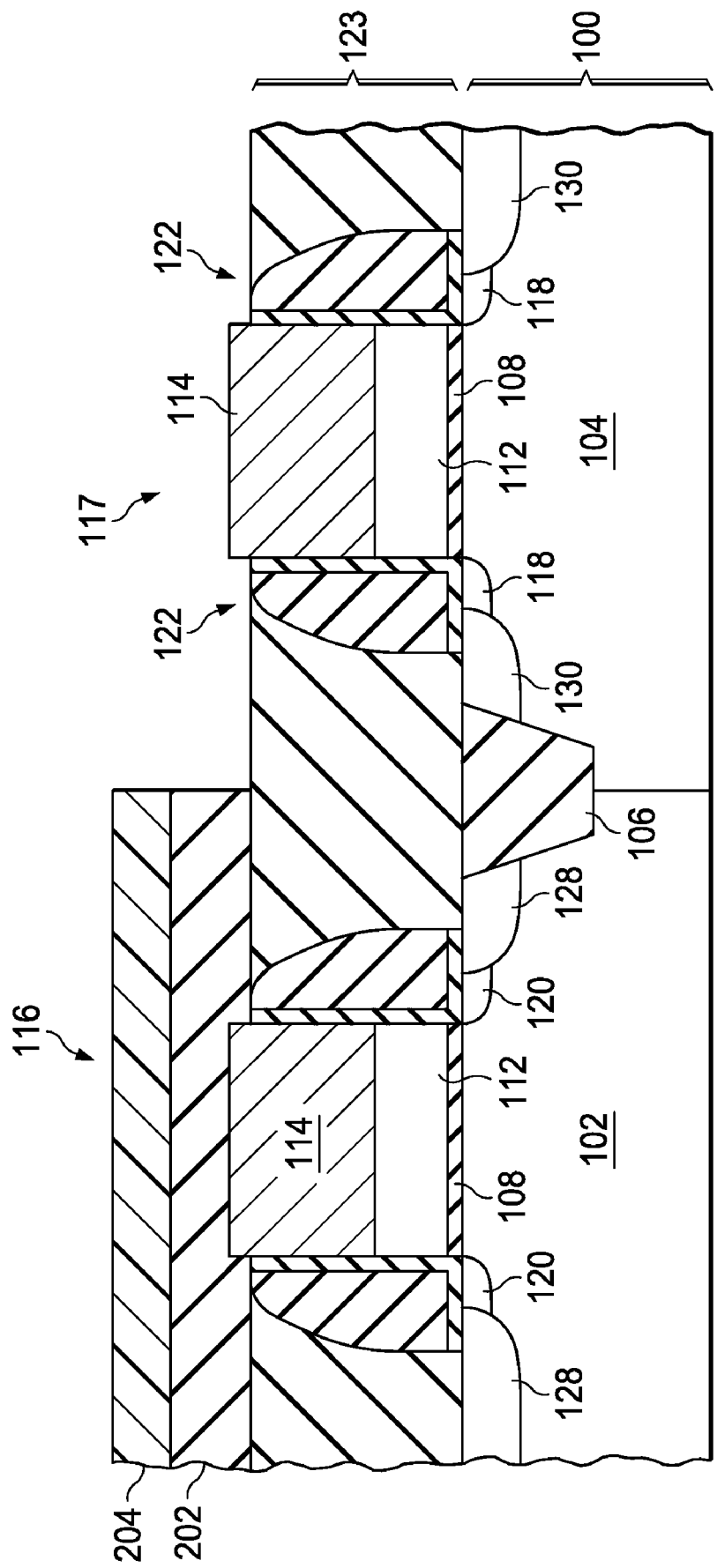
FIGS. 2A-2F show portions of another exemplary process for forming an integrated circuit using a metal gate replacement process according to an embodiment of the present invention.
Figure 2B:
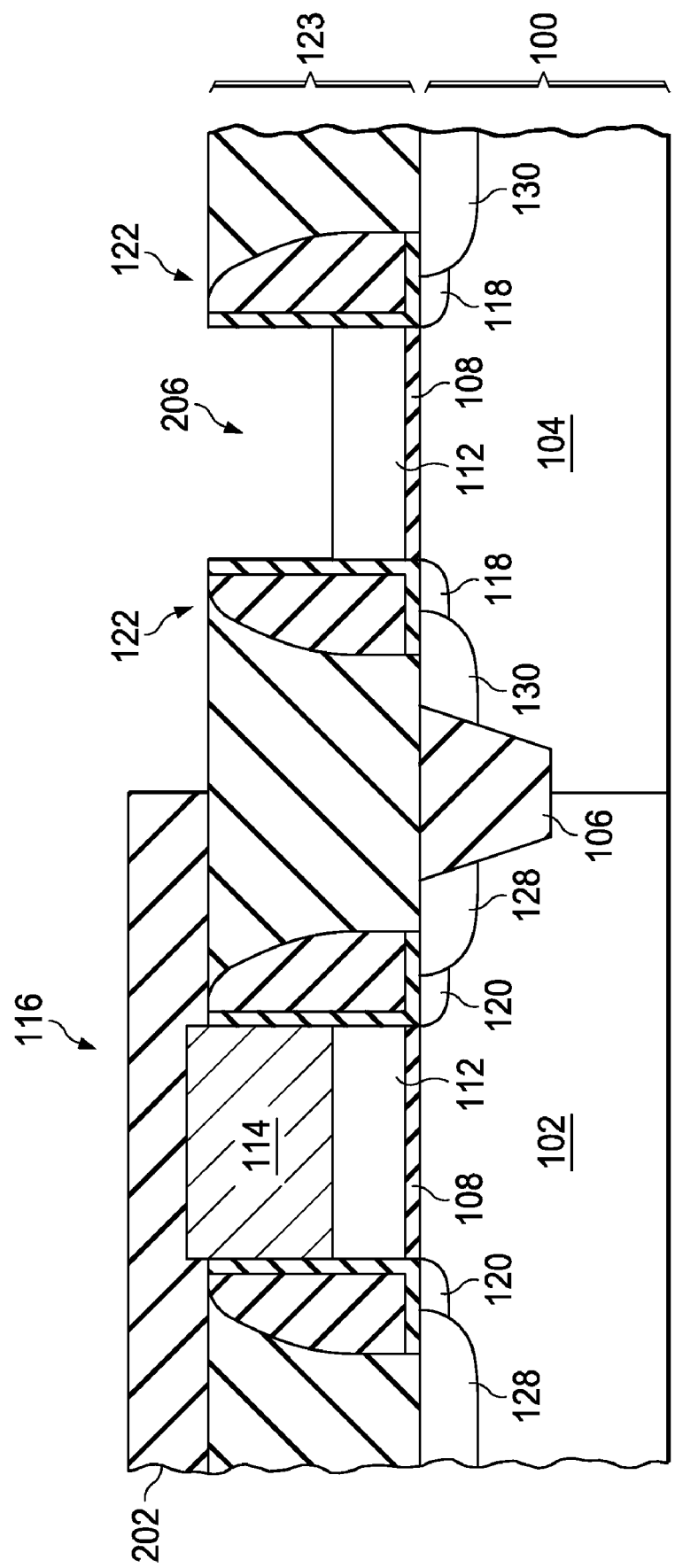
Figure 2C:
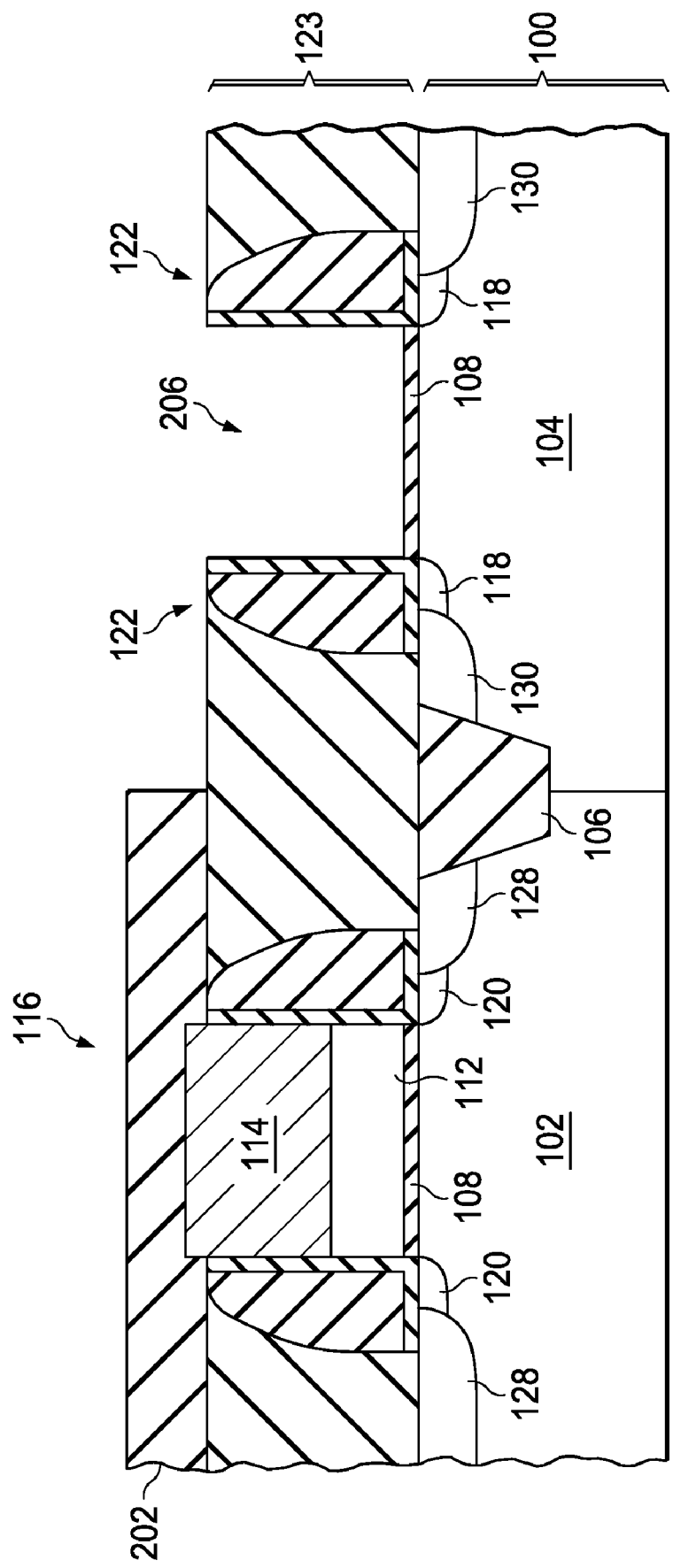
Figure 2D:
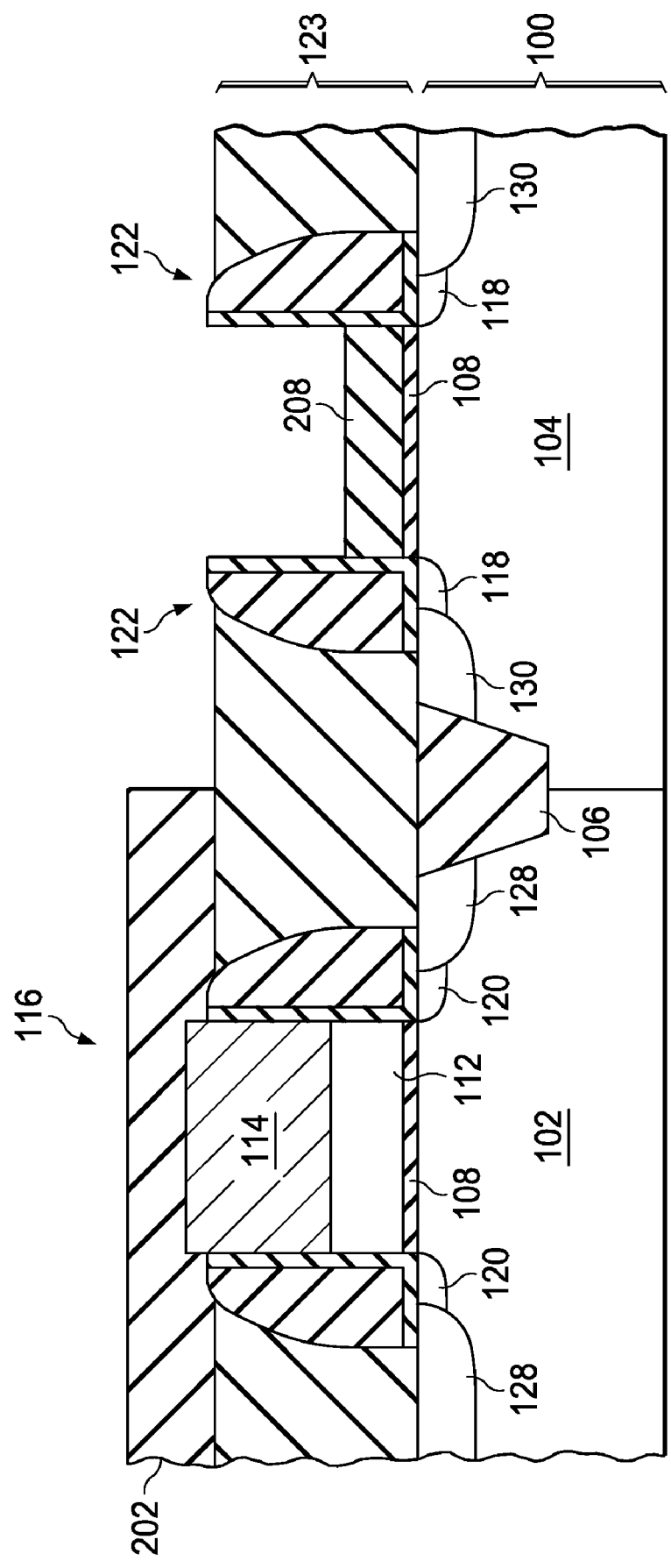
Figure 2E:
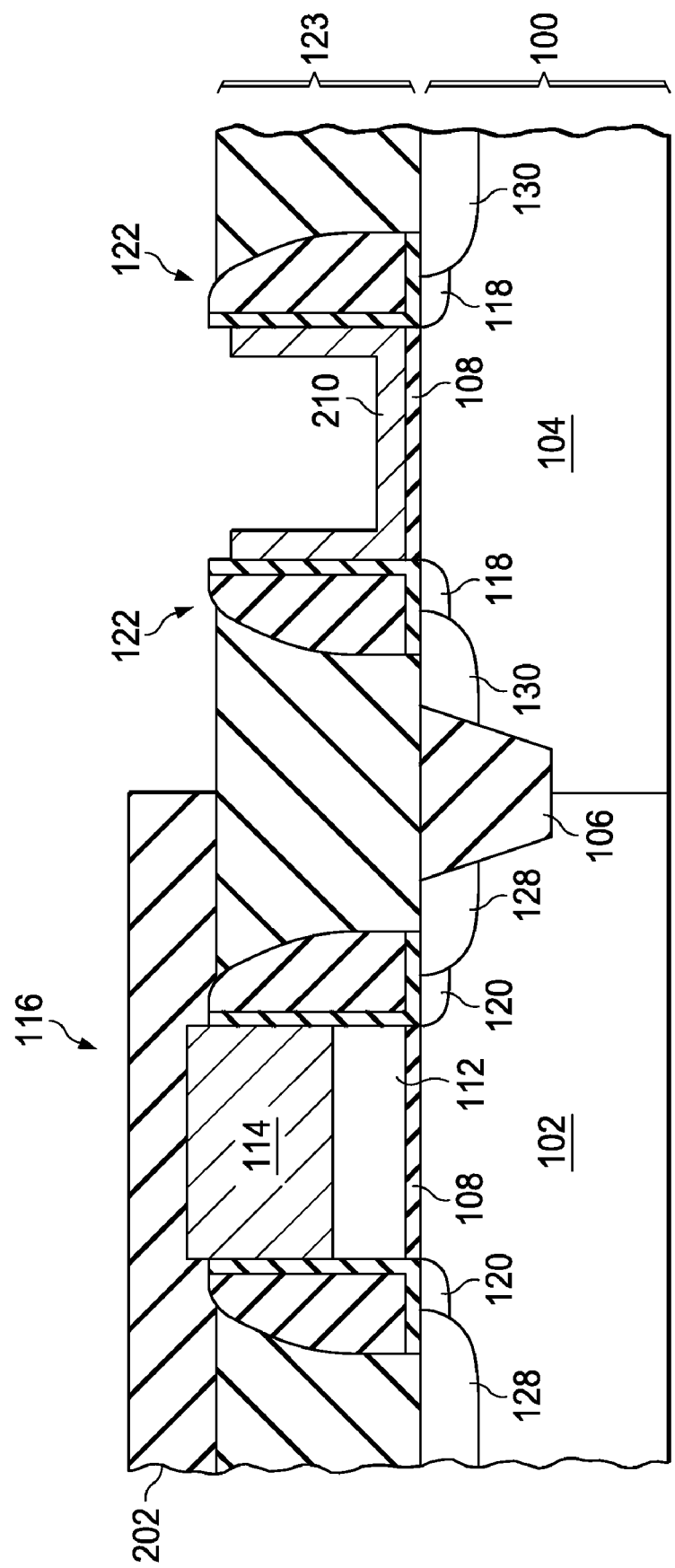

In some embodiments, once the features 116, 117 and spacers 122 are formed, as shown in FIG. 1E, rather than etching the capping layer 114 in features 116, 117, at least a portion of the NMOS devices can be masked to prevent etching of the feature 116 during processing of feature 117, a shown in FIG. 2A. In this embodiment, a masking layer 202 can be formed over the substrate 100, dielectric layer 123, the spacers 122, and features 116, 117. A silicon dioxide material can be used for the masking layer 202, but other materials or combinations of materials (silicon dioxides, nitrides, oxynitrides) having suitable selectivity to the materials of the underlying features can be used. A resist pattern 204 can then be formed over the NMOS features 116, to prevent etching of the masking layer 202 over the NMOS features 116. The patterned substrate 100 can then be transferred, for example, to a wet chemical bench to remove the masking layer, although any other suitable process can be utilized. The removal of the portions of the masking layer 202 then results in the structure illustrated in FIG. 2A, where the PMOS features 117 are exposed and NMOS features 116 are masked. Subsequently, the capping layer 114 of the PMOS feature 117 can be removed to form trench 206, as shown in FIG. 2B. Afterwards, the base layer 112 in feature 117 can be removed, as previously discussed, resulting in the structures of FIG. 2C. The NMOS features 116, protected by the masking layer 202, are not affected by the SiGe or polysilicon etches. A low temperature metal 208 can then be deposited on the substrate and patterned to form the PMOS gate electrode 210, as shown in FIGS. 2D and 2E. Optionally, as previously discussed, the PMOS gate insulator can be replaced as well, prior to metal deposition.

In the various embodiments, the metal 208 for the PMOS gate electrode can comprise any conductive material having a favorable work function for PMOS devices. Materials that may be used to form metal 208 include: iridium, tungsten, ruthenium, palladium, platinum, cobalt, nickel, and conductive metal oxides, e.g., ruthenium oxide. The metal 208 can be formed on gate insulator using well-known PVD or CVD processes, e.g., conventional sputter or atomic layer CVD processes. Subsequently, as shown in FIG. 2E, the low temperature metal 208 is only patterned where it fills trench 206 to form the metal gate electrode 210. The low temperature metal may be removed from other portions of the device via a wet or dry etch process, or an appropriate CMP operations known in the art, by adding other dielectric features or masking layers to serve as an etch or polish stop. The metal 208 can serve as a metal PMOS gate electrode 210, and has a thickness that is between about 25 to 100 Å, such as between about 40 and 60 Å.

Figure 2F:
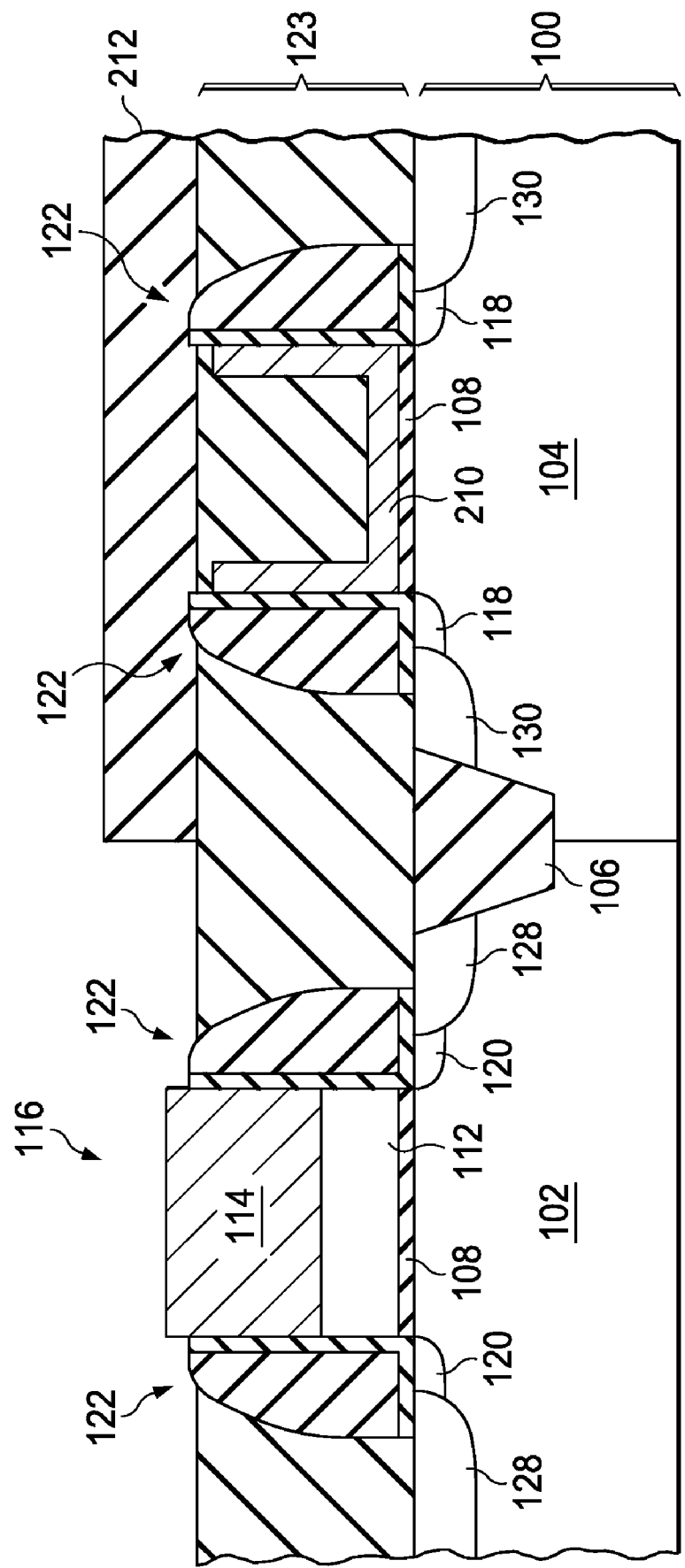

Once the PMOS metal gate electrodes 210 are formed, an identical process can be used to form NMOS metal gate electrodes. In such embodiments, a masking layer 212 is formed over PMOS features 117, as shown in FIG. 2F, allowing the NMOS metal gate electrodes to be formed separately, repeating the process used to form the PMOS metal gate electrodes 210, but using a different metal. Although the illustrated process flow shows the formation of PMOS metal gate electrodes prior to the formation of NMOS metal gate electrodes, it is within the scope of the present invention to form metal gate electrodes in any order. Furthermore, it is within the scope of the present invention to form different metal gate electrodes for different types of NMOS and PMOS devices. For example, in an integrated circuit the types of metals for memory device gate electrodes may be different than the types of metals used for logic device gate electrodes. Subsequently, after the metal gate electrodes for the all MOS devices are formed, a conventional back-end process flow can be used to complete the integrated circuit, as previously described.

The metal for forming NMOS metal gate electrodes can comprise any conductive material having a favorable work function for NMOS devices. Materials that may be used to form n-type metal gate electrodes can include: hafnium, zirconium, titanium, tantalum, aluminum, and their alloys, e.g., metal carbides that include these elements, i.e., hafnium carbide, zirconium carbide, titanium carbide, titanium nitride, titanium silicon nitride, tantalum carbide, and aluminum carbide. N-type metal gate electrodes can be formed on a high-k gate dielectric layer using well-known PVD or CVD processes, e.g., conventional sputter or atomic layer CVD processes. The n-type metal electrodes can be formed using a similar process flow than that of the p-type metal gate electrodes 310. The deposited metal can serve as a metal NMOS gate electrode, and has a thickness that is between about 25 to 100 Å, such as between about 40 and 60 Å.

As previously discussed, the p-type and n-type metals fill only part of the trenches formed after etching the SiGe portions 114 and polysilicon layers 112 of features 116, 117. In such embodiments, the remainder of such trenches can be filled with a material that can be easily polished, e.g., tungsten, aluminum, titanium, or titanium nitride. These filler materials can be deposited separately or concurrently, depending on the necessary process flow or desired work function for the particular gate electrode. However, it is also within the scope of the present invention to use thicker amounts of low temperature metals, including amounts that would fill the trenches entirely.

Figure 3A:
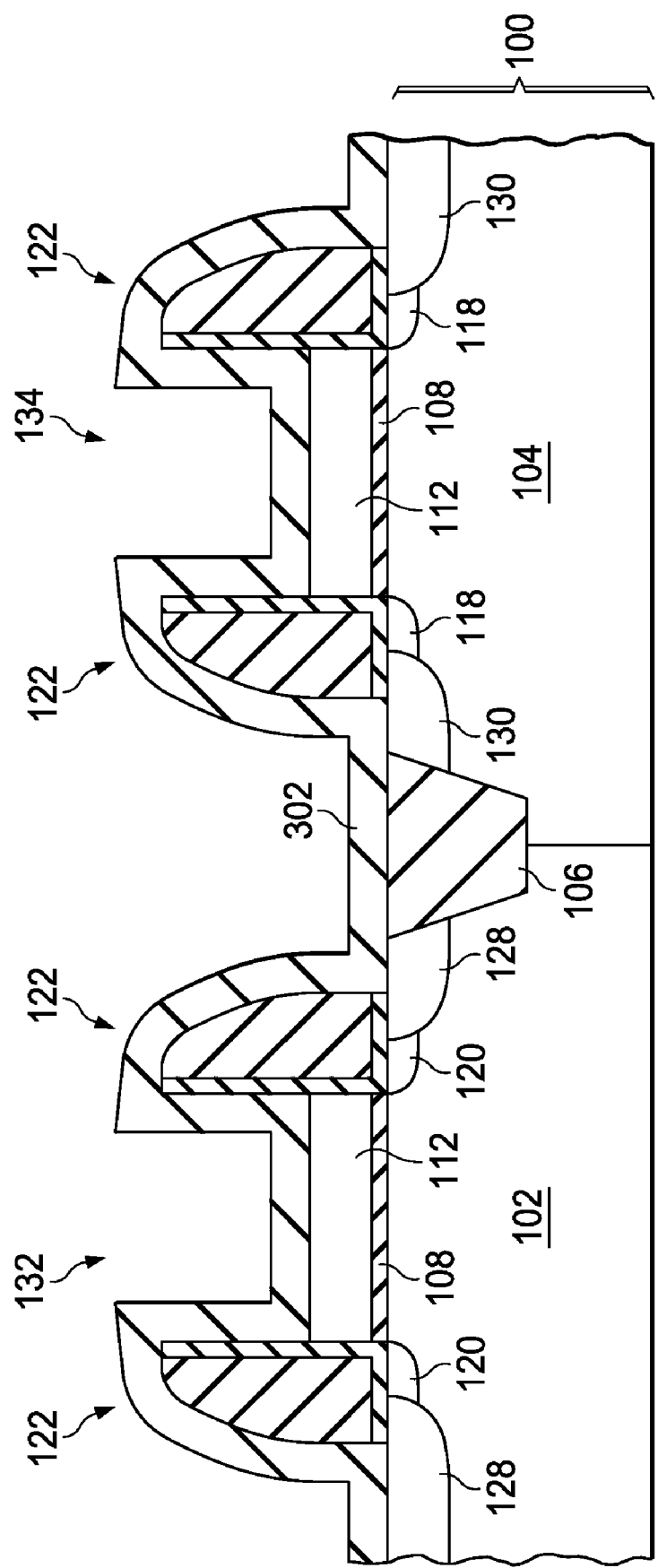
FIGS. 3A-3B show portions of an alternate exemplary process for forming an integrated circuit using a fully silicided gate process according to an embodiment of the present invention.
Figure 3B:
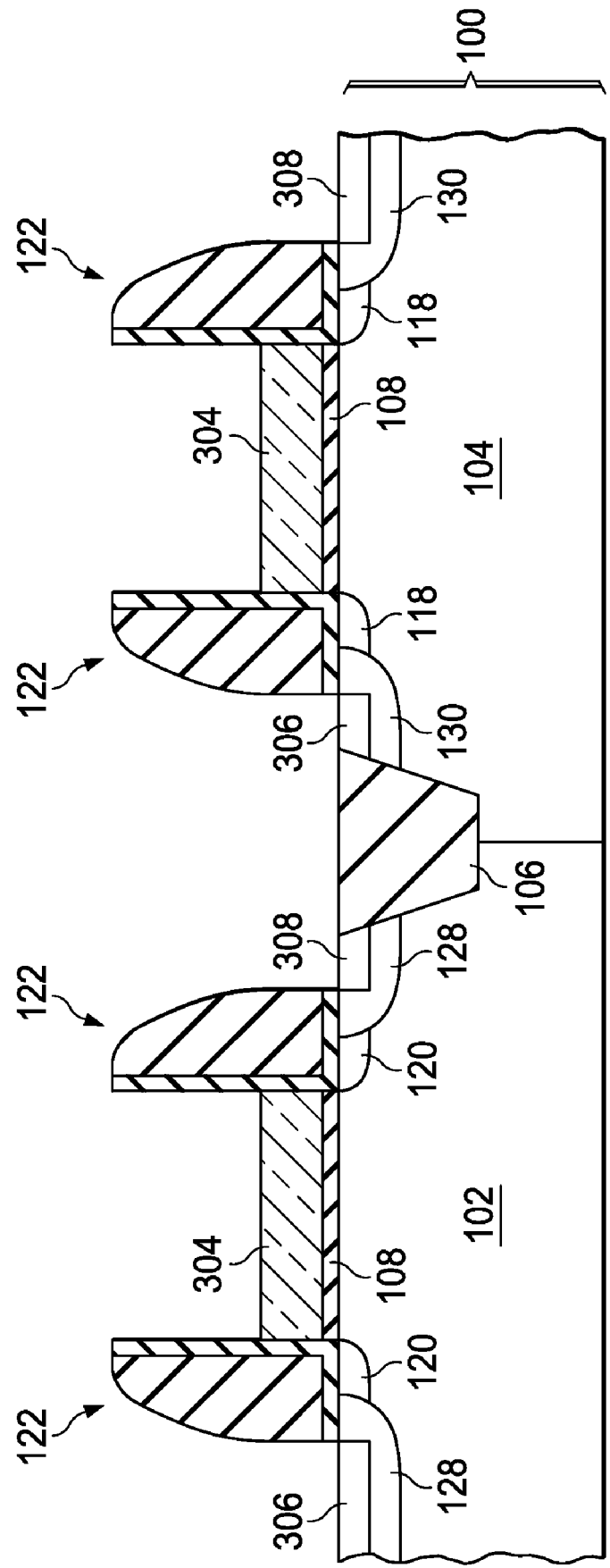

As previously discussed, some embodiments of the present invention can be used in conjunction with a fully silicided gate (FUSI) process. In such embodiments, rather than removing the remaining base layer 112 in the trenches 132, 134, as shown in FIG. 1G, the polysilicon can be used to form a metal gate using a silicide. Therefore, after removal of the capping layer 114, as shown in FIG. 1F, a deposition of a thin metal layer 302 is used, as shown in FIG. 3A. Metals such as Ti, Pt, Pd, W, Co, and Ni can be used for layer 302. After a subsequent annealing step (e.g., 300-500° C.), the metal forms a silicide 304 with the polysilicon layer 112, as shown in FIG. 3B. Furthermore, a silicide can also be formed in the source and drain regions 128, 130, resulting in a fully silicided polysilicon layer 304 and partially silicided sources and drains 306, 308. Exposed oxide or nitride on the substrate 100 is not affected in this step, such as the spacers 122 or STI regions 106. FIG. 3B shows the resulting structure after the step of removing the remaining silicide metal in a conventional etch process.

As shown in FIG. 3B, the silicided polysilicon does not fill all of trenches 132, 134. In such embodiments, the remainder of the trenches 132, 134 may be filled with a material that may be easily polished or otherwise etched, e.g., tungsten, aluminum (etched), titanium, or titanium nitride. In such embodiments, the low temperature metal layers 136, 138 can be between about 50 and about 1,000 Å thick. However, the invention is not limited in this regard and metals can be selected to react with underlying polysilicon that result in a volume expansion for the resulting silicide. In such embodiments, the reaction of the silicide metal and polysilicon can result in a silicide that fills a volume of the trench greater than the volume filed by the polysilicon. For example, the silicide can expand to fill the entire depth of the trench. In either case, a conventional back-end process flow can be used to complete the integrated circuit, as previously described.

Although FIGS. 3A and 3B illustrate the formation of gate silicide 304 and source and drain silicides 306, 308 occurring concurrently, in some embodiments the gate silicide 304 can be formed separately from the source and drain silicides 306, 308. Such a process flow can be necessary when the necessary thickness for the source and drain silicides 306, 308 cannot be achieved during a gate silicide process and vice versa. In such embodiments, the gate regions or the source and drain regions can be masked using a masking layer to prevent silicide metals from forming on reactive surfaces.

Figure 4A:
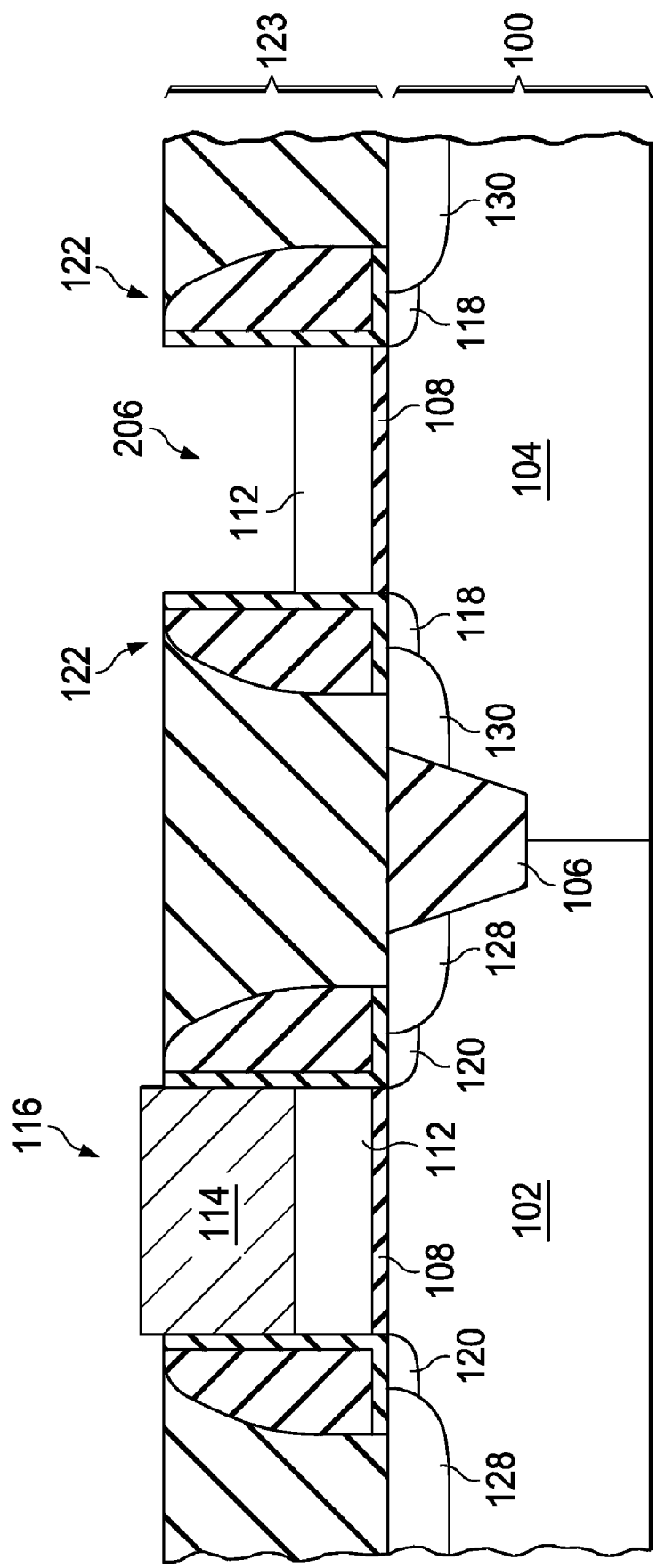
FIGS. 4A-4C show portions of an alternate exemplary process for forming an integrated circuit using a fully silicided gate process according to another embodiment of the present invention.
Figure 4B:
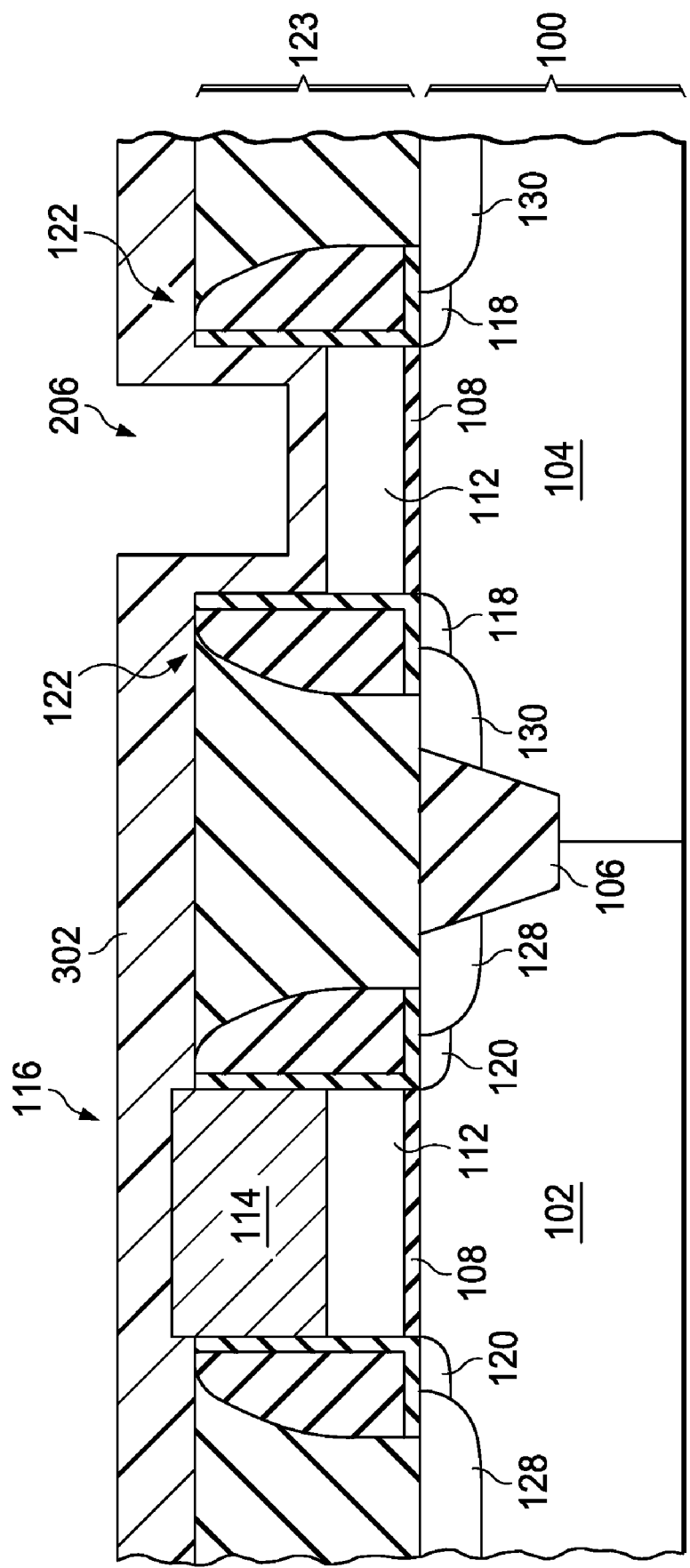
Figure 4C:
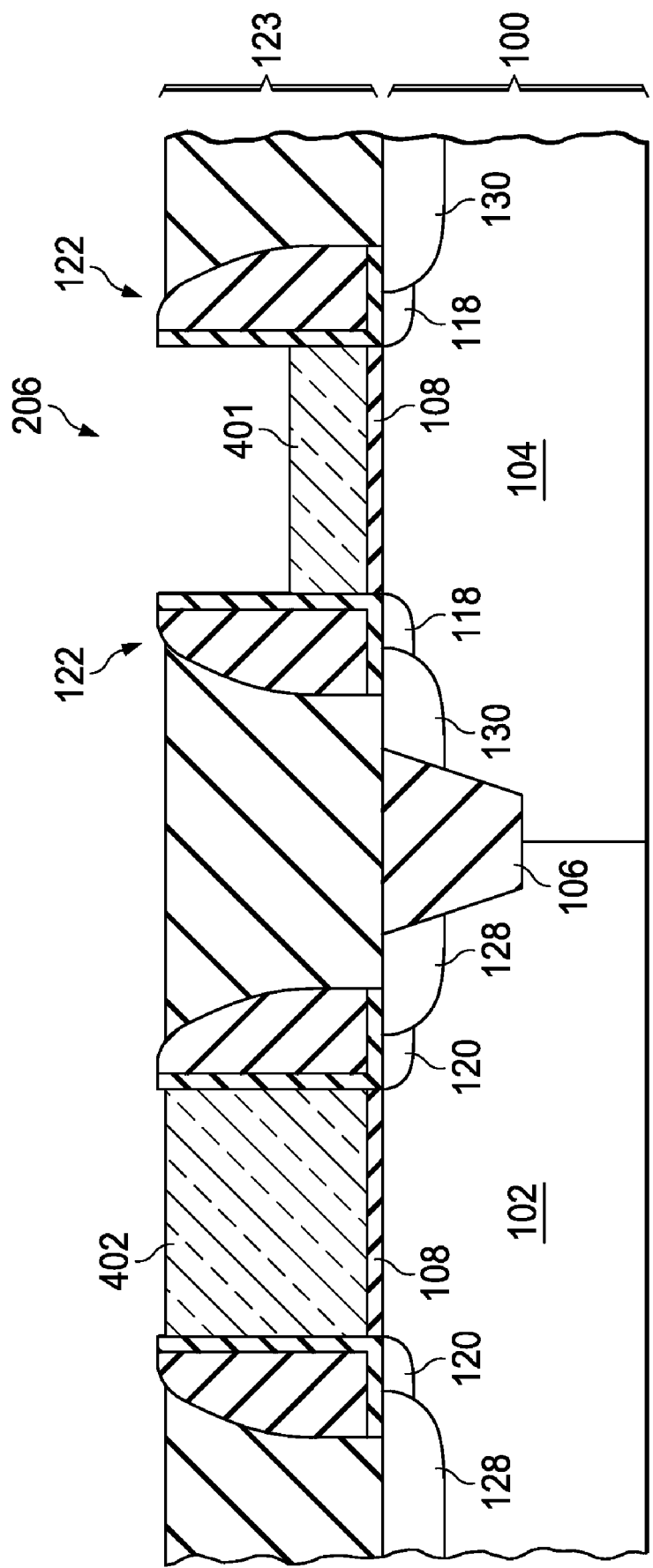

As illustrated with reference to FIGS. 4A-4C, embodiments of the present invention can also be used to form silicides with work functions that are advantageous for PMOS and NMOS transistors. For example, after the structure in FIG. 2B is formed, the masking layer 202 can be removed to simultaneously expose the SiGe capping layer 114 in feature 116 and polysilicon base layer 112 in trench 206 see FIG. 4A prior to depositing silicide metal 302 (see FIG. 4B), as previously described for FIG. 3A. The silicide metal 302 and the underlying SiGe capping layer 114 in feature 116 and polysilicon base layer in trench 206 can then be exposed to a thermal process to cause them to react and form a silicide. However, because the volume of the polysilicon base layer 112 is smaller than the volume of the SiGe capping layer 114, the phase of the silicide 401 formed in trench 206 (see FIG. 4C) can be different than that formed by silicide 402 in feature 116. In particular, the phase of silicide 401 has a higher silicide metal content, resulting in a work function that is more advantageous for PMOS devices. The phase of silicide 402, in contrast, has a lower silicide metal content, resulting in a work function that is more advantageous for NMOS devices. Subsequently, a conventional back-end process flow can be used to complete the integrated circuit, as previously described.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of forming a complementary metal oxide semiconductor (CMOS) integrated circuit, comprising the steps of:

providing a semiconducting substrate having respective regions for forming NMOS and PMOS devices;

forming a plurality of gate stacks on said substrate surface in said NMOS and PMOS device regions, said gate stacks each comprising a polysilicon base layer and a silicon germanium (SiGe) capping layer on said base layer;

forming spacers on sidewalls of said plurality of gate stacks;

etching said SiGe capping layer, wherein said etching comprises selectively removing said SiGe capping layer simultaneously in said NMOS and PMOS device regions using an etchant that is selective to said polysilicon base layer;

after removing said SiGe capping layer, removing at least a portion of said polysilicon base layer simultaneously in said NMOS and PMOS device regions to form a plurality of trenches; and after removing said at least a portion of said polysilicon base layer, forming metal gate electrodes in said trenches.

2. The method of claim 1, further comprising the step of implanting at least one dopant into said gate stacks and said substrate, wherein said implant has a peak concentration above $1 \times 10^{-18}$ cm$^{-3}$ at a surface of said SiGe capping layer and a given range Rp and straggle ΔRp; and said SiGe capping layer has a thickness greater than Rp+2ΔRp sufficient to mask the implant to keep dopant concentration in said polysilicon base layer below $1 \times 10^{-18}$ cm$^{-3}$.

3. The method of claim 1, wherein a thickness of said SiGe capping layer is between 60% and 80% of the total thickness of said SiGe capping layer and said polysilicon base layer.

4. The method of claim 1, wherein said SiGe capping layer has an atomic concentration of at least 20% germanium.

5. The method of claim 1, wherein said selective etching wet etching comprises using an aqueous solution comprising a NH$_4$OH base and an oxidizer.

6. The method of claim 5, wherein said oxidizer comprises H$_2$O$_2$.

7. The method of claim 1, wherein said gate stacks further comprise a dielectric layer between said polysilicon base layer and said substrate.

8. The method of claim 7, wherein removing at least a portion of said polysilicon base layer comprises selectively etching all of said polysilicon layer.

9. The method of claim 8, wherein forming gate electrodes in said trenches comprises depositing and patterning a metal layer on said dielectric layer.

10. The method of claim 8, further comprising
etching said dielectric layer, to remove at least a portion of said dielectric layer from at least one of said gate stacks; and forming another gate dielectric layer in said at least one of said gate stacks; and wherein forming gate electrodes in said trenches comprises depositing and patterning a metal on said another gate dielectric layer.

11. The method of claim 1, wherein forming metal gate electrodes in said trenches comprises:
   forming a silicide metal on a remaining portion of said polysilicon layer; and
   reacting said silicide metal and said remaining portion of said polysilicon layer to form a silicide.

12. A method of forming an integrated circuit, comprising the steps of:
   providing a semiconducting substrate having respective regions for forming NMOS and PMOS devices;
   forming a plurality of gate stacks on said substrate in said NMOS and PMOS regions, said gate stacks each comprising a dielectric layer, a polysilicon layer over said dielectric layer, and a silicon germanium (SiGe) layer on said polysilicon layer;
   forming spacers on sidewalls of said gate stacks;
   implanting n-type and p-type dopants respectively in said NMOS and PMOS regions to form source/drains in said substrate adjacent said gate stacks after forming said spacers;
   after implanting said dopants, selectively etching said SiGe layer, wherein said etching removes said SiGe layer simultaneously in said NMOS and PMOS regions using an etchant that is selective to said polysilicon layer; thereby leaving trenches between said spacers; and
   forming metal gate electrodes in said trenches over said dielectric layer after removing said SiGe layer.

13. The method of claim 12, wherein forming metal gate electrodes in said trenches comprises:
   forming a silicide metal on said polysilicon layer; and
   reacting said silicide metal and said polysilicon layer to form a silicide.

14. The method of claim 12, wherein said SiGe layer has a concentration of at least 20% germanium.

15. The method of claim 12, wherein said selective etching comprises wet etching using an aqueous solution comprising $NH_4OH$ and $H_2O_2$.

16. The method of claim 12, wherein said dielectric layer comprises a high-k dielectric.

17. The method of claim 12, wherein a thickness of said SiGe layer is between 60% and 80% of the total thickness of said SiGe layer and said polysilicon layer.

18. The method of claim 12, further comprising, after removing said SiGe layer, removing at least a portion of said polysilicon base layer simultaneously in said NMOS and PMOS device regions to form said plurality of trenches; and wherein forming metal gate electrodes in said trenches comprises depositing a low temperature metal over said dielectric layer in said trenches.

19. The method of claim 12, wherein said implanting implants dopant into said gate stacks, with said SiGe layer masking said polysilicon layer to keep dopant concentration in said polysilicon layer below $1 \times 10^{-18}$ cm$^{-3}$.

20. A method of forming an integrated circuit, comprising the steps of:
   providing a semiconducting substrate having respective regions for forming NMOS and PMOS devices;
   forming a plurality of gate stacks on said substrate in said NMOS and PMOS regions, said gate stacks each comprising a dielectric layer, a polysilicon layer over said dielectric layer, and a silicon germanium (SiGe) layer on said polysilicon layer; said SiGe layer having a concentration of at least 20% germanium and a thickness of between 60% and 80% of the total thickness of said SiGe layer and said polysilicon layer;
   implanting n-type and p-type dopants respectively in said NMOS and PMOS regions to form source/drain extensions adjacent said gate stacks;
   forming spacers on sidewalls of said gate stacks;
   implanting n-type and p-type dopants respectively in said NMOS and PMOS regions to form source/drains in said substrate adjacent said gate stacks after forming said spacers;
   after implanting said dopants, selectively etching said SiGe layer, wherein said etching removes said SiGe layer simultaneously in said NMOS and PMOS regions using an etchant that is selective to said polysilicon layer; thereby leaving trenches between said spacers; and
   forming metal gate electrodes in said trenches over said dielectric layer after removing said SiGe layer.

21. The method of claim 20, wherein forming metal gate electrodes in said trenches comprises:
   forming a silicide metal on said polysilicon layer; and
   reacting said silicide metal and said polysilicon layer to form a silicide.

22. The method of claim 20, wherein implanting said source/drain extensions and implanting said source/drains also implants dopant into said gate stacks, with said SiGe layer masking said polysilicon layer to keep dopant concentration in said polysilicon layer below $1 \times 10^{-18}$ cm$^{-3}$.

23. The method of claim 22, wherein said selective etching comprises wet etching using an aqueous solution comprising $NH_4OH$ and $H_2O_2$.

24. The method of claim 23, wherein said $H_2O_2$ is 10% $H_2O_2$ in water; and said ratio of $NH_4OH$, $H_2O_2$ (10% in water) and water is 1:2:8 to 1:1:2.

25. The method of claim 23, further comprising, after removing said SiGe layer, removing at least a portion of said polysilicon base layer simultaneously in said NMOS and PMOS device regions to form said plurality of trenches; and wherein forming metal gate electrodes in said trenches comprises depositing a low temperature metal over said dielectric layer in said trenches.

* * * * *